US006696901B1

United States Patent
Takeda et al.

(10) Patent No.: US 6,696,901 B1
(45) Date of Patent: Feb. 24, 2004

(54) CONCENTRATED CONSTANT IRRECIPROCAL DEVICE

(75) Inventors: Shigeru Takeda, Kumagaya (JP); Yasushi Kishimoto, Tottori (JP); Hiroyuki Itoh, Iwami-gun (JP); Kouji Ichikawa, Ohmiya (JP); Shuichi Watanabe, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/700,916

(22) PCT Filed: Mar. 27, 2000

(86) PCT No.: PCT/JP00/01858
§ 371 (c)(1),
(2), (4) Date: Feb. 2, 2001

(87) PCT Pub. No.: WO00/59065
PCT Pub. Date: Oct. 5, 2000

(30) Foreign Application Priority Data

Mar. 26, 1999 (JP) .............................. 11-083642
Nov. 11, 1999 (JP) .......................... 11-320647

(51) Int. Cl.[7] ................ H01P 1/36; H01P 1/38
(52) U.S. Cl. ........................... 333/1.1; 333/24.2
(58) Field of Search .................. 333/1.1, 24.2

(56) References Cited

U.S. PATENT DOCUMENTS 3,836,874 A * 9/1974 Maeda et al. ............... 333/1.1
5,945,887 A 8/1999 Makino et al. ............... 333/1.1

FOREIGN PATENT DOCUMENTS

| JP | 56-20322 A | * | 3/1981 | ............ H03H/7/52 |
| JP | 58085609 A | | 5/1983 | |
| JP | 07015212 A | * | 1/1995 | ............ H01P/1/213 |
| JP | 09055607 A | * | 2/1997 | ............ H01P/1/383 |
| JP | 10-327003 | * | 12/1998 | ............ H01P/1/383 |

* cited by examiner

Primary Examiner—Robert Pascal
Assistant Examiner—Stephen E. Jones
(74) Attorney, Agent, or Firm—Finnegan, Henderson, Farabow, Garrett & Dunner L.L.P.

(57) ABSTRACT

A concentrated constant, non-reciprocal device comprising a permanent magnet for applying a DC magnetic field to a ferrimagnetic body, an assembly in which at least a part of a plurality of center conductors one end of which serves as a common terminal and the other of which serves as a first input/output terminal is wound on or embedded in the ferrimagnetic body, a plurality of second input/output terminals, a plurality of impedance converting circuits connected between the second input/output terminals and the first input/output terminals, respectively, and a plurality of load capacitors connected between the first input/output terminals and the common terminals, respectively. The input impedance $Z_i$ of the corresponding first input/output terminal at the operating center frequency and an external impedance $Z_o$ connected with the corresponding second input/output terminal satisfy $0.05 \leq Z_i/Z_o \leq 0.9$. As a result, it is possible to provide a small concentrated constant circulator/isolator of a wide band width having excellent electric characteristics.

7 Claims, 16 Drawing Sheets

CONCENTRATED CONSTANT IRRECIPROCAL DEVICE

FIELD OF THE INVENTION

The present invention relates to a concentrated-constant, non-reciprocal device for use in a microwave band comprising a ferrimagnetic body, particularly to a miniaturized, broad-band concentrated-constant circulator/isolator.

BACKGROUND OF THE INVENTION

According to recent miniaturization of semiconductor elements such as ICs, transistors, etc., passive elements such as laminated chip capacitors, laminated chip inductors, chip resisters, etc., microwave devices surface-mounted with such elements are rapidly miniaturized and reduced in thickness. In such circumstances, concentrated-constant, non-reciprocal devices extremely important for microwave devices are also required to be miniaturized and reduced in thickness.

As a conventional concentrated-constant, non-reciprocal device, there is, for instance, a concentrated-constant isolator having three terminals, one of which is connected to a resister $R_o$. In the concentrated-constant isolator, a signal does not substantially attenuate in a transmission direction, though it is extremely decreased in the opposite direction. Thus, the concentrated-constant isolator is used for mobile communications equipments such as cellular phones.

FIGS. 22(a) and (b) schematically show the structure of such a concentrated-constant isolator. This concentrated-constant isolator has a structure in which three sets of center conductors 1a, 1b, 1c are intertwined on a ferrimagnetic body 2. One side of the center conductors functions as input/output terminals ①, ②, ③, and the other is connected to a common part 3 (ground conductor in this example), with crossing portions of the center conductors free from short-circuiting by insulating sheets 4. Capacitors C connected between the input/output terminals ①, ②, ③ and the common part 3 (ground conductor) determines an operating frequency of the circulator. By applying an external magnetic field 5 to the ferrimagnetic body 2, the circulator is operated at a desired impedance $Z_0$. Also, to function as an isolator, a resister $R_0$ is connected between the input/output terminal ③ and the common part (ground conductor) 3.

FIG. 23 shows an equivalent circuit of the above concentrated-constant isolator, in which each terminal of an ideal circulator having three input/output terminals ①, ② and ③ is connected to an LC parallel resonance circuit. In the figure, the terminal ① is an input terminal; the terminal ② is an output terminal; and the terminal ③ is connected to a resister $R_0$ having the same resistance as that of the impedance $Z_0$. In FIGS. 22 and 23, C is capacitance, and L is inductance in the ferrimagnetic body 2, around which the center conductors are wound. The inductance L changes depending on the external magnetic field 5. In the circulator adjusted to match the external impedance $Z_0$, the LC resonance circuit is resonant at a center frequency $f_0$, while input impedance $Z_0$ is zero when a matching load is connected to each terminal.

As another example of the concentrated-constant, non-reciprocal devices, there is a two-terminal, concentrated-constant isolator schematically shown in FIGS. 24(a) and (b). In the two-terminal, concentrated-constant isolator, two sets of center conductors 1a, 1b are disposed substantially in a perpendicularly crossing manner on the ferrimagnetic body 2. One end of each center conductor is an input/output terminal ①, ②, and the other end is connected to a common part 3 (ground conductor in this example), with crossing portions of the center conductors free from short-circuiting by insulating sheets 4. Capacitors C connected between the input/output terminals ①, ②, and the common part 3 (ground conductor) determines an operating frequency of the circulator. By applying an external magnetic field 5 to the ferrimagnetic body 2, the circulator is operated at a desired impedance $Z_0$. Also, in the case of transmission in the opposite direction, a resister $R_0$ is connected between the terminals ① and ② for energy absorption.

FIG. 25 shows an equivalent circuit of the above two-terminal, concentrated-constant isolator, in which each terminal of an ideal non-reciprocal phase shifter having two input/output terminals ① and ② is connected to an LC parallel resonance circuit. In the figure, the terminal ① is an input terminal; the terminal ② is an output terminal; and an ideal non-reciprocal phase shifter is connected in parallel to a resister $R_0$ for absorbing energy at the time of transmission in an opposite direction. This ideal non-reciprocal phase shifter makes the phase advance by $2\pi$ when the microwave proceeds in a forward direction, while it makes the phase advance by $\pi$ when the microwave proceeds in the opposite direction. In FIGS. 24 and 25, C is capacitance, and L is inductance in the ferrimagnetic body, around which the center conductors are wound. The inductance L changes depending on the external magnetic field 5. In the isolator adjusted to match the external impedance $Z_0$, the LC resonance circuit is resonant at a center frequency $f_0$, while input impedance $Z_0$ is zero when each terminal is connected to a matching load.

In general, the sizes of the concentrated-constant, non-reciprocal devices in the above two examples are determined by the sizes of ferrimagnetic bodies (garnet) 2 included therein. The optimum size of the ferrimagnetic body is about ⅛ of a wavelength $\lambda g$ of an electromagnetic wave proceeding in the ferrimagnetic body, at which the ferrimagnetic body is operated in a magnetic field providing the smallest insertion loss. However, because extreme miniaturization makes the ferrimagnetic body 2 much smaller than the optimum size, a magnetic field has to be large, resulting in drastically narrowed bandwidth.

According to recent increase in the number of users, necessity is generated to cover a wide bandwidth by a single cellular phone. Particularly in a cellular phone usable in a relatively low bandwidth such as 800 MHz, miniaturized, wide-band concentrated-constant circulator/isolators are strongly desired. However, because miniaturization contradicts with the relative bandwidth as described above, the miniaturization of the concentrated-constant, non-reciprocal device simply by reducing the size of the ferrimagnetic body leads to the problem that it fails to cover all the bandwidth necessary for cellular phones.

Accordingly, an object of the present invention is to overcome the above problems in the prior art technologies, thereby providing a miniaturized, wide-band, concentrated-constant, non-reciprocal device, for instance, a circulator or an isolator.

DISCLOSURE OF THE INVENTION

The concentrated-constant, non-reciprocal device of the present invention comprises a permanent magnet for applying a DC magnetic field to a ferrimagnetic body; an assembly comprising a plurality of center conductors wound around or at least partly embedded in the ferrimagnetic body, each center conductor having one end as a common terminal and the other end as a first input/output terminal; a plurality of second input/output terminals; a plurality of impedance-converting circuits each connected between the second input/output terminal and the first input/output terminal; and a plurality of load capacitors each connected between the first input/output terminal and the common terminal; wherein the input impedance $Z_i$ of the first input/output terminals and the external impedance $Z_0$ connected to the second input/output terminals meet the relation of $0.05 \leq Z_i/Z_0 \leq 0.9$ at an operating center frequency thereof.

The impedance-converting circuit preferably comprises inductance connected between each first input/output terminal and each second input/output terminal, and electrostatic capacitance connected between each second input/output terminal and a ground conductor. The impedance-converting circuit preferably has electrostatic capacitance smaller than the load capacitance. The inductance of the impedance-converting circuit is preferably provided by a distributed constant line.

The number of the second input/output terminals is preferably three, a resister being connected between one of the second input/output terminals and the ground conductor or the common terminal, whereby the concentrated-constant, non-reciprocal device is operated as an isolator. Also, a resister may be connected between one of the three first input/output terminals and the ground conductor or the common terminal, whereby the concentrated-constant, non-reciprocal device is operated as an isolator.

The inductance and electrostatic capacitance of the impedance-converting circuit and the load capacitance are preferably formed in an integral structure. The integral structure is preferably a ceramic laminate produced by laminating a plurality of green ceramic sheets printed with electrodes, and sintering the resultant laminate at a temperature of 800–1100° C.

The integral structure may also be produced by forming at least inductance and electrostatic capacitance of the impedance-converting circuits and the load capacitance connected between the first input/output terminals and the common terminal on the same insulating substrate by a thin-film-forming method.

BRIEF DESCRIPTION OF THE DRAWINGS

FIG. 22($b$) is a cross-sectional view showing the conventional concentrated-constant isolator of FIG. 22($a$);

FIG. 24($b$) is a cross-sectional view showing the conventional two-terminal concentrated-constant isolator of FIG. 24($a$)

BEST MODE FOR CARRYING OUT THE INVENTION

[1] Ferrimagnetic Body

Figure 1:
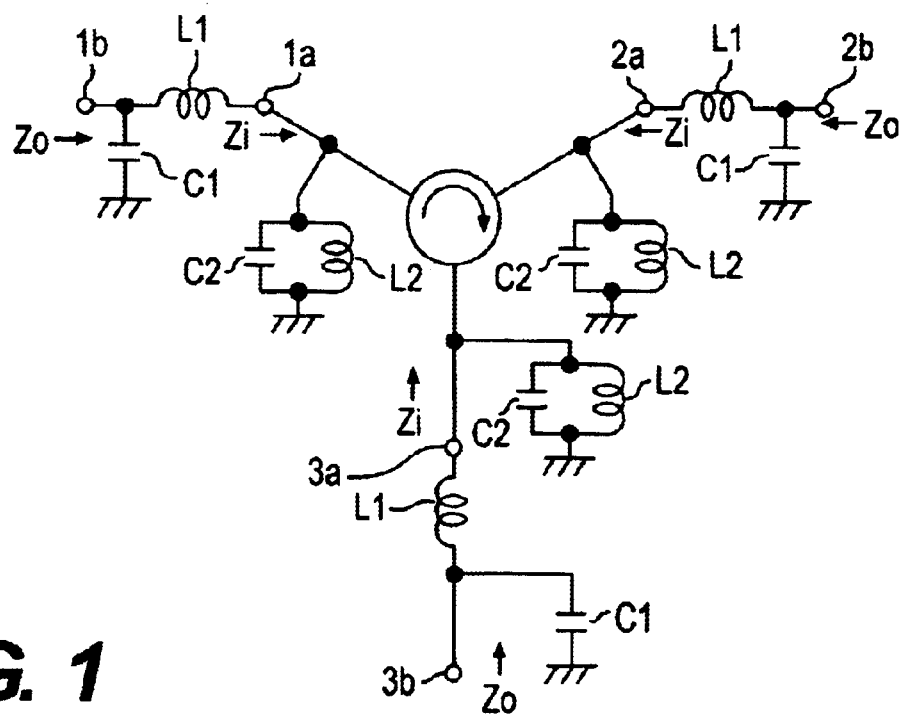
FIG. 1 is a schematic view showing the equivalent circuit of the concentrated-constant, non-reciprocal device according to one embodiment of the present invention.

The basic principle of miniaturization according to the present invention will be explained, taking a three-terminal concentrated-constant circulator having an objective structure as an example. When an external circuit connected to the circulator has a line impedance $Z_0$ (usually 50 Ω), the relation expressed by the formula (1) below should substantially be satisfied between the saturation magnetization $4\pi Ms$ and the air-core inductance K of the ferrimagnetic body, to operate the circulator at the desired impedance $Z_0$ by applying an external magnetic field 5 to the ferrimagnetic body 2. The formula (1) is modified from the formula (10) in "Improvement of Temperature Characteristics of VHF-Band, Concentrated-Constant Circulator," Takeda and Kawashima, The Journal of The Electronic Communications Association, '85/6, Vol. J68-B, No. 6, p.693.

$$(H_{in}+4\pi Ms)K^{1/2}=A \cdot (Z_0 \cdot 4\pi Ms)^{1/2} \qquad (1),$$

wherein A is a constant, and $H_{in}$ is an internal magnetic field expressed by the following formula (2):

$$H_{in}=H_{ext}-N \cdot 4\pi Ms \qquad (2),$$

wherein $H_{ext}$ is an external magnetic field, and N is an effective demagnetizing factor.

With the above formula (1) in mind, problems will be discussed below on the miniaturization (reduction of air-core inductance K) of the circulator. If the line impedance $Z_0$ and the saturation magnetization $4\pi Ms$ of the ferrimagnetic body are constant, the right side in the formula (1) is constant, resulting in the fact that the internal magnetic field $H_{in}$ should be increased to decrease the air-core inductance K. Increase in the internal magnetic field $H_{in}$ results in decrease in the inductance L of a portion of the ferrimagnetic body, around which the center conductors are wound, leading to the narrowing of a bandwidth. Therefore, to operate the circulator optimally, it is necessary to keep the internal magnetic field $H_{in}$ constant.

Figure 22A:
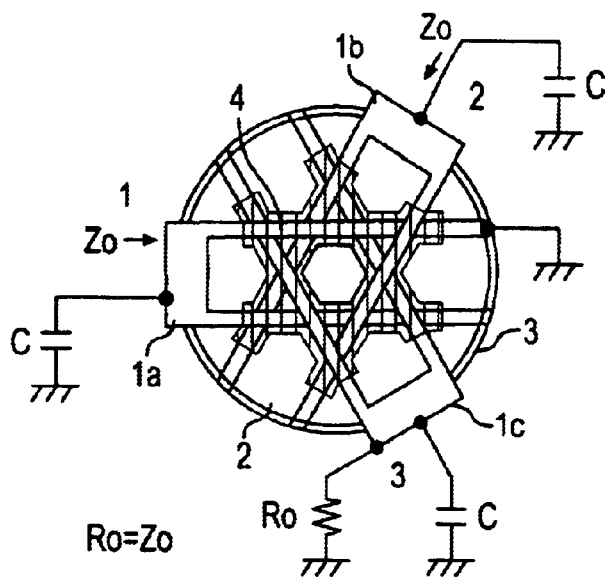
FIG. 22($a$) is a plan view showing a conventional concentrated-constant isolator.
Figure 22B:
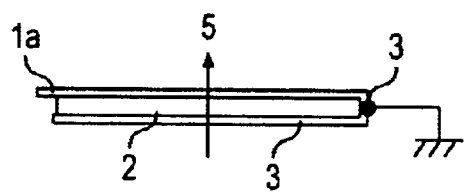
Figure 23:
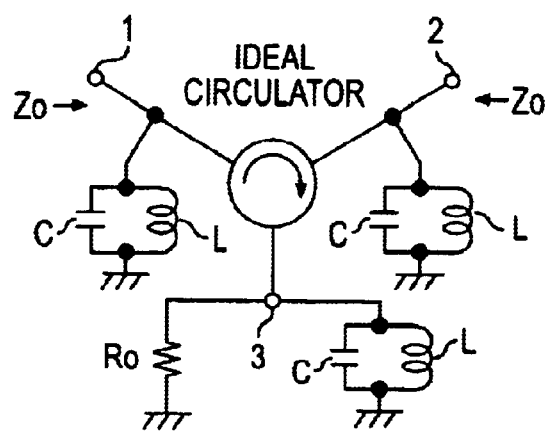
FIG. 23 is a schematic view showing the equivalent circuit of the conventional concentrated-constant isolator of FIG. 22($a$)
Figure 24A:
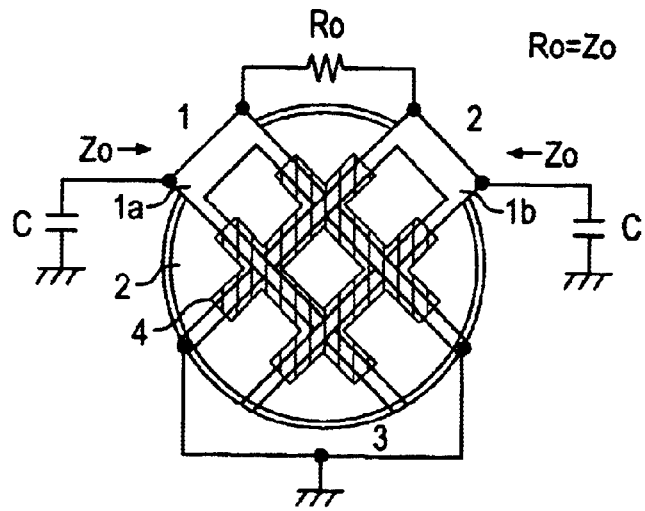
FIG. 24($a$) is a plan view showing a conventional two-terminal concentrated-constant isolator.
Figure 24B:
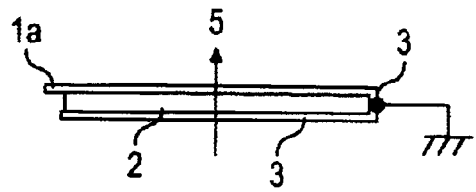
Figure 25:
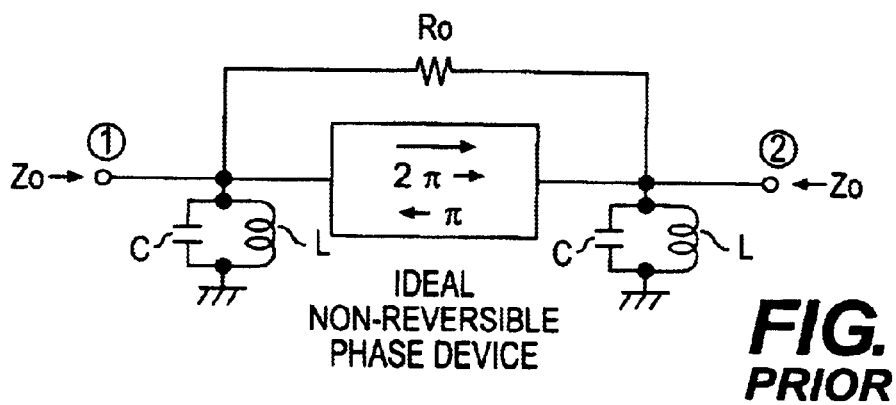
FIG. 25 is a schematic view showing the equivalent circuit of the conventional two-terminal concentrated-constant isolator of FIG. 24($a$).

One method for keeping the internal magnetic field $H_{in}$ constant even when the air-core inductance K decreases by the miniaturization of the circulator is to reduce the impedance $Z_0$ of the connected external circuit in proportion to the air-core inductance K. That is, when the air-core inductance is reduced from K to $K_i$ by miniaturizing the ferrimagnetic body, the impedance $Z_0$ of the external circuit needs only to be reduced to $Z_i$. After all, to keep the internal magnetic field $H_{in}$ constant, the relation of $K_i/K=Z_i/Z_0$ needs only to be satisfied. In the case of the circulator shown in FIG. 22, for instance, the miniaturized, concentrated-constant circulator can be provided with constant $H_{in}$ (constant bandwidth), by adjusting the circulator such that the input impedance of the terminal ① is $Z_i$, when a matching load of impedance $Z_i$ is connected to an air-core inductance $K_i$ and the terminals ②, ③ of the miniaturized, concentrated-constant circulator.

Figure 3:
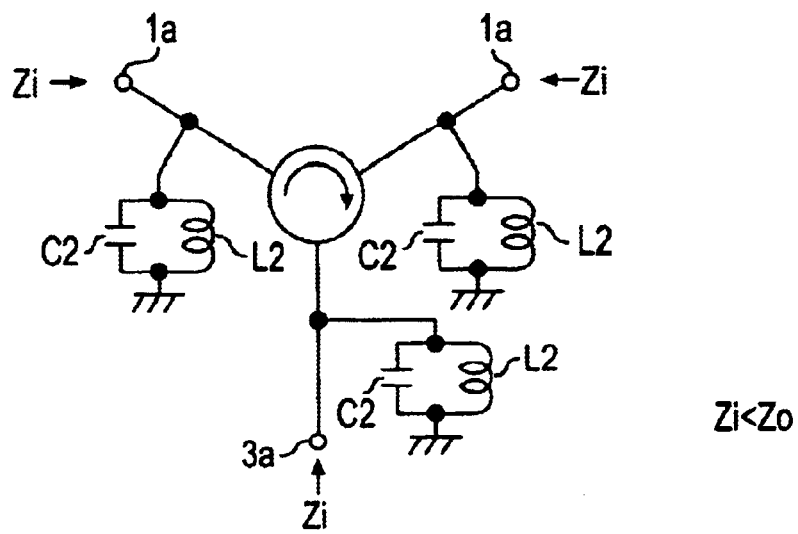
FIG. 3 is a schematic view showing the equivalent circuit of the low-impedance circulator according to one embodiment of the present invention.

By adjusting the input impedance $Z_i$ to smaller than $Z_0$ according to the principle of the present invention, it is possible to obtain a miniaturized concentrated-constant circulator with reduced air-core inductance K. FIG. 3 shows the equivalent circuit of the concentrated-constant circulator adjusted to have impedance reduced to $Z_i$ smaller than $Z_0$. In this concentrated-constant circulator, each terminal of an ideal circulator having three input/output terminals ①a, ②a, ③a is connected to a parallel resonance circuit comprising load capacitance $C_2$ and inductance $L_2$ of a portion of the ferrimagnetic body 2 around which center conductors are wound. Hereinafter, $Z_i$ is called internal impedance, and $Z_0$ is called external impedance.

Figure 2:
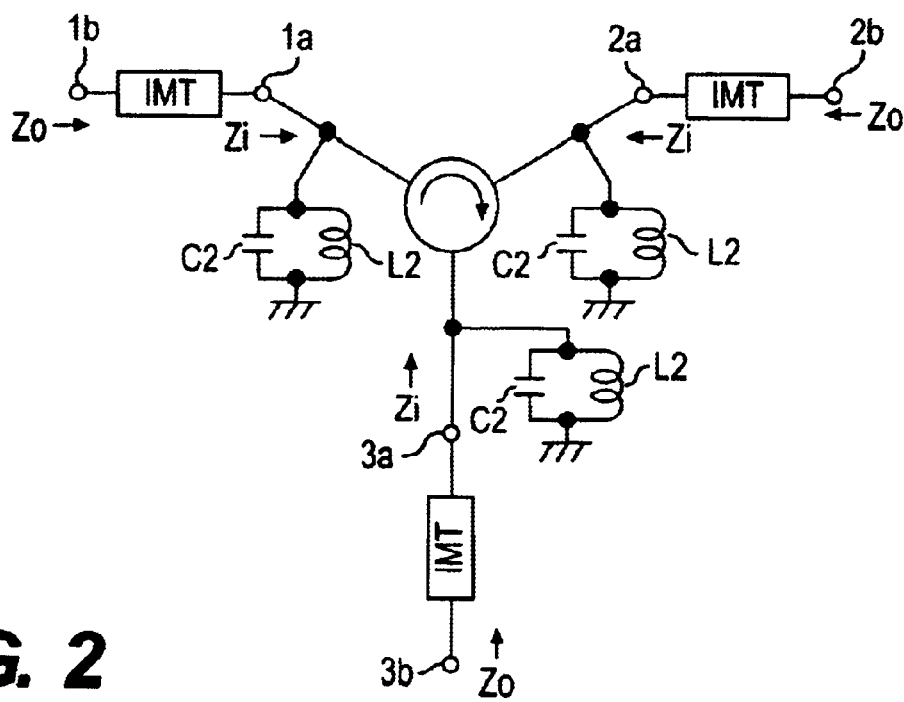
FIG. 2 is a schematic view showing the equivalent circuit of the concentrated-constant, non-reciprocal device according to another embodiment of the present invention.

[2] Impedance-converting Circuit IMT (A) Structure of Impedance-converting Circuit IMT To use the circulator in a line of impedance $Z_0$, as shown in FIG. 2, an impedance-converting circuits IMT are inserted between the first input/output terminals ①a, ②a, ③a and the lines of impedance $Z_0$ in the circulator. Here, the input/output terminals ①b, ②b, ③b of the impedance-converting circuits IMT on the side of $Z_0$ are called second input/output terminals, distinguished from the first input/output terminals ①a, ②a, ③a.

Each impedance-converting circuit IMT is preferably constituted not by a resistance element but by inductance and electrostatic capacitance, taking into consideration the insertion loss of the overall concentrated-constant circulator, to which the impedance-converting circuits IMT are added. As shown in FIG. 1, each impedance-converting circuit IMT is constituted by an L-type circuit comprising electrostatic capacitance $C_1$ between the second input/output terminals ①b, ②b, ③b on the side of larger impedance $Z_0$ and a ground conductor, and inductance $L_1$ between the second input/output terminals ①b, ②b, ③b and the first input/output terminals ①a, ②a, ③a.

To match the external impedance $Z_0$ with the internal impedance $Z_i$ at a center frequency $f_0$, $C_1$ and $L_1$ should meet the following relations:

$$C_1 = (1/\omega \cdot Z_0)\sqrt{(Z_0-Z_i)/Z_i} \quad [F] \qquad (3),$$

and $$L_1 = (Z_i/\omega)\sqrt{(Z_0-Z_i)/Z_i} \quad [H] \qquad (4),$$

wherein ω is an angular frequency $2\pi f_0$.

Figure 4:
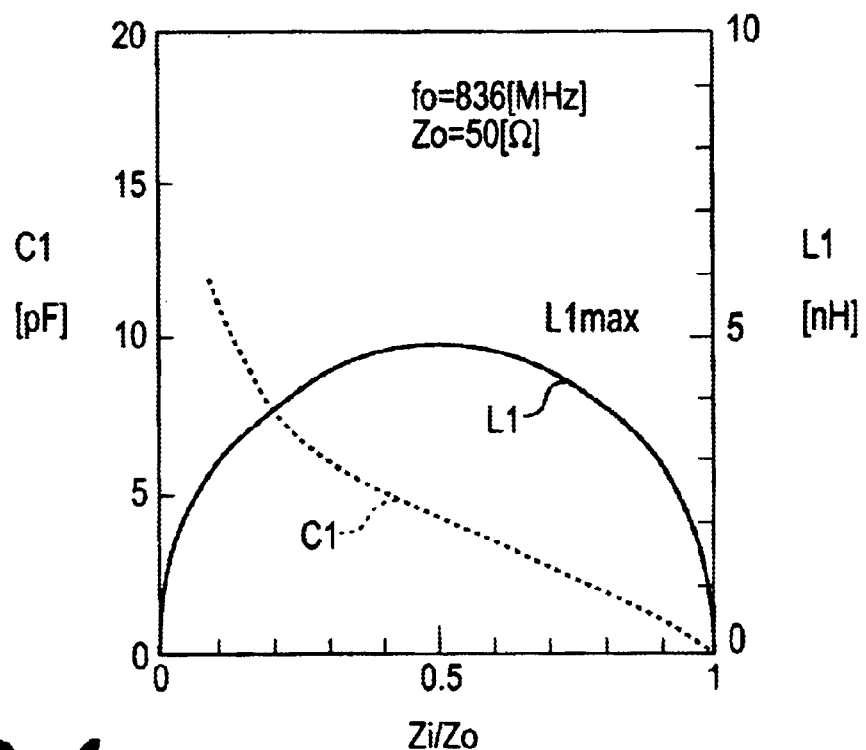
FIG. 4 is a graph showing the relations between inductance $L_1$ and electrostatic capacitance $C_1$ and a conversion ratio $Z_i/Z_0$ in the impedance-converting circuit of the concentrated-constant, non-reciprocal device according to one embodiment of the present invention.

FIG. 4 shows that $C_1$ and $L_1$ [respectively expressed by the formulas (3) and (4)] at $f_0$=836 MHz and $Z_0$=50 Ω. $C_1$ linearly increases as $Z_i/Z_0$ decreases, while $L_1$ reaches a maximum value $L_{1max}$ at $Z_i/Z_0$=0.5, indicating a symmetric variation. In general, when the center frequency $f_0$ (MHz) is set, $L_{1max}$ is determined as follows:

$$L_{1max}=3979/f_0 \ [nH] \qquad (5)$$

It is known from this equation that when increase in insertion loss by the impedance-converting circuit takes place mainly due to the resistance of $L_1$, the insertion loss has an upper limit, not drastically increasing even at $Z_i/Z_0$ of 0.5 or less.

(B) Optimum Relation of External Impedance $Z_0$ and Internal Impedance $Z_i$

Figure 5:
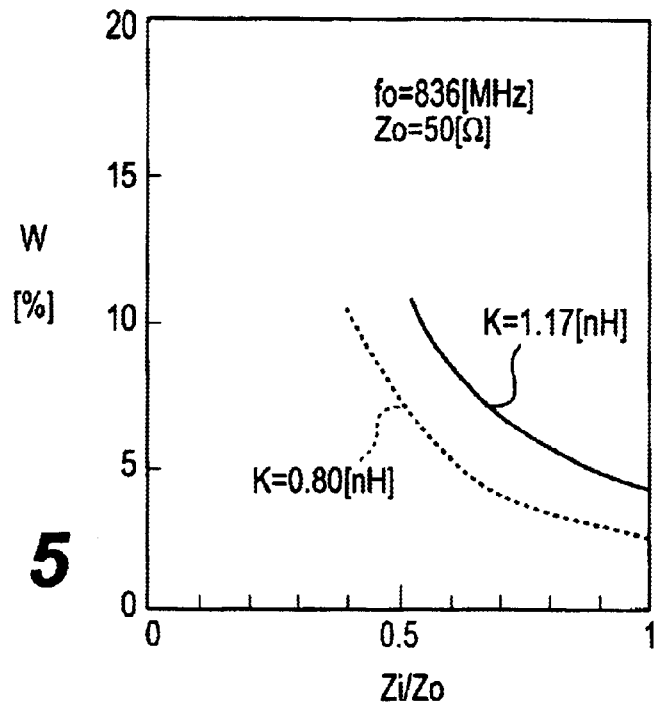
FIG. 5 is a graph showing the relations between a relative bandwidth W and a conversion ratio $Z_i/Z_0$ in the impedance-converting circuit of the concentrated-constant, non-reciprocal device according to one embodiment of the present invention.

FIG. 5 shows how a relative bandwidth W changes when the conversion ratio $Z_i/Z_0$ of the impedance-converting circuit changes at a constant air-core inductance K (without changing the shapes of the ferrimagnetic body and the center conductor) at $f_0$=836 MHz and $Z_0$=50 Ω. When two circulators provided with small ferrimagnetic bodies having air-core inductance K of 1.17 nH and 0.80 nH, respectively are adjusted to match an external impedance $Z_0$=50Ω ($Z_i$=$Z_0$), their relative bandwidths W are 3.9% and 2.4 %, respectively at an opposite-direction insertion loss of 20 dB, failing to achieve a practically required level of 5% or more.

However, when the impedance-converting circuit of the present invention meeting the formulas (3) and (4) is added to adjust the internal impedance $Z_i$ to 0.85 $Z_0$ or 0.60 $Z_0$, the relative bandwidth W becomes 5% or more. Thus, even a circulator having a relative bandwidth W lower than the required level can be turned to a circulator satisfying the standard, if the impedance-converting circuit of the present invention is used. Particular effects are obtained at $Z_i/Z_0 \leq 0.9$.

Figure 6:
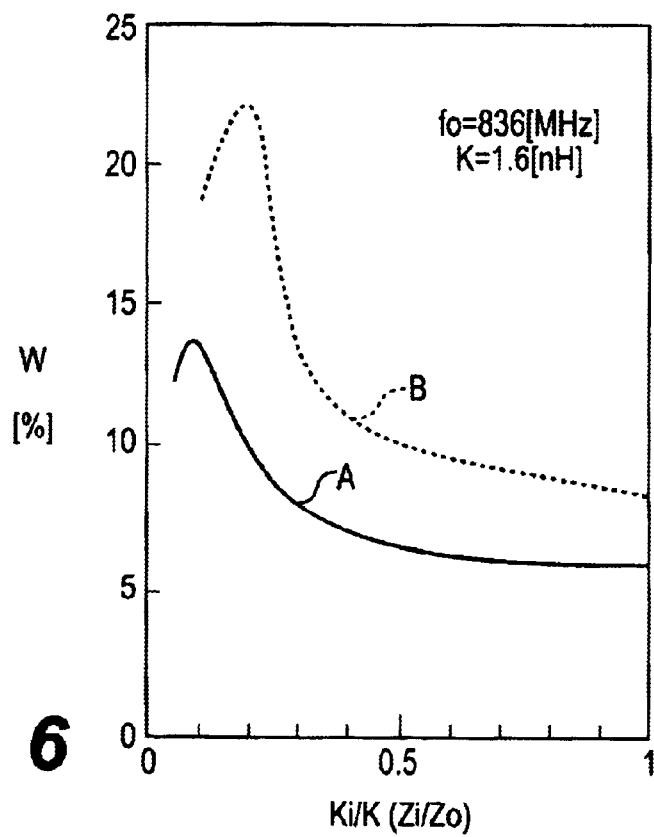
FIG. 6 is a graph showing the relations between a relative bandwidth W and $K_i/K$ ($Z_i/Z_0$) in the impedance-converting circuit of the concentrated-constant, non-reciprocal device according to one embodiment of the present invention.

FIG. 6 shows how a relative bandwidth W changes, when the conversion ratio $Z_i/Z_0$ of the impedance-converting circuit changes without changing an internal magnetic field $H_{in}$ in the ferrimagnetic body, even with a small air-core inductance K (even if miniaturized) at $f_0$=836 MHz. Here, the air-core inductance K is 1.6 nH at a conversion ratio $Z_i/Z_0$=1, namely when there is no impedance-converting circuit. In FIG. 6, the curve A indicates a case where one ferrimagnetic body is used, and the curve B indicates a case where two ferrimagnetic bodies are used, with a center conductor sandwiched by them. The relative bandwidths W were 5.76% and 8.29%, respectively at $Z_i/Z_0$32 1.

As shown in FIG. 6, the relative bandwidth W increases even though the internal magnetic field $H_{in}$ is constant, when the ferrimagnetic body is miniaturized ($K_i/K$ is reduced), thereby reducing an impedance conversion ratio $Z_i/Z_0$ (=$K_i/K$). In the case of the curve A, the relative bandwidth W reaches a maximum level of 14% at $Z_i/Z_0$ (=$K_i/K$)=0.1. Also, in the case of the curve B, the relative bandwidth W reaches a maximum level of 22% at $Z_i/Z_0$ (=$K_i/K$)=0.2. It is known from FIG. 6 that such increase in the relative bandwidth W can be achieved at $Z_i/Z_0$ of 0.05 or more. Thus, with the impedance-converting circuit of the present invention, the concentrated-constant circulator can be miniaturized and provided with an expanded bandwidth.

Figure 7:
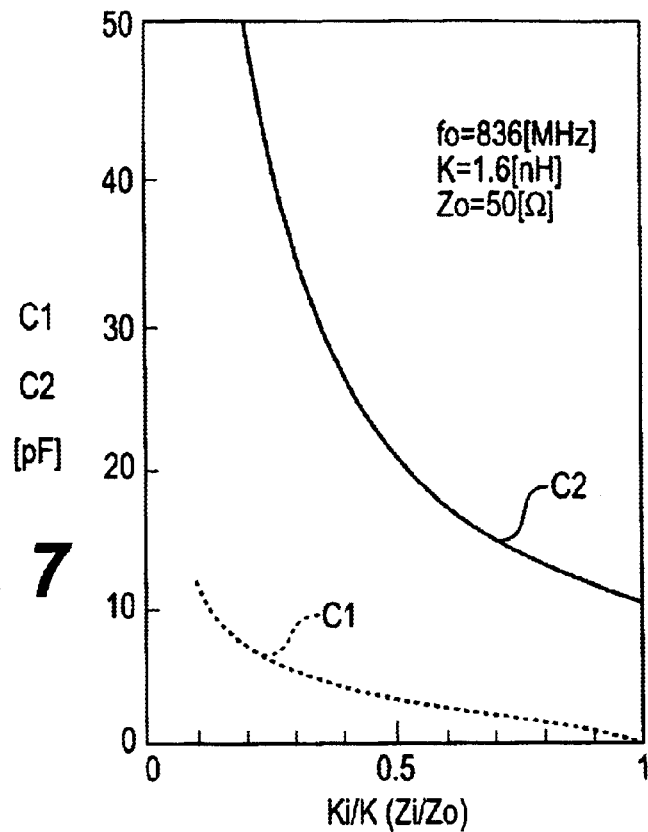
FIG. 7 is a graph showing the variation of electrostatic capacitance $C_1$ and load capacitance $C_2$ with $K_i/K$ in an embodiment of the present invention.

FIG. 7 shows the variation of a load capacitance $C_2$ and an electrostatic capacitance $C_1$ with $K_i/K$ (=$Z_i/Z_0$) in the case of the curve A in FIG. 6 in which there is one ferrimagnetic body. Though the load capacitance $C_2$ rapidly increases in inverse proportion to decrease in $K_i/K$, the electrostatic capacitance $C_1$ does not rapidly increase, resulting in the load capacitance $C_2$ always larger than the electrostatic capacitance $C_1$. Also, the load capacitance $C_2$ is extremely large at $Z_i/Z_0$<0.05, failing to satisfy practical purposes.

(C) Structure of Concentrated-constant, Non-reciprocal Device

Another feature of the present invention is that inductance $L_1$, electrostatic capacitance $C_1$ and load capacitance $C_2$ are integrated in the impedance-converting circuit IMT.

Figure 8:
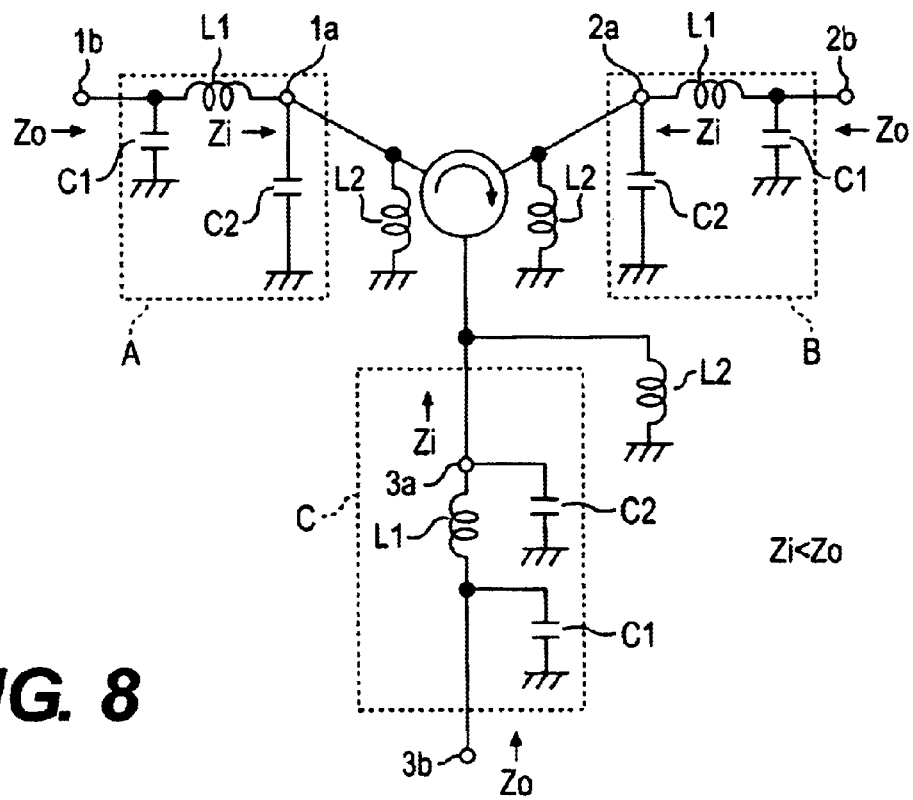
FIG. 8 is a schematic view showing the equivalent circuit of the concentrated-constant, non-reciprocal device according to a further embodiment of the present invention.

In the equivalent circuit of the concentrated-constant, non-reciprocal device shown in FIG. 8, for instance, portions A, B and C (encircled by broken line) in the terminals are integrated separately or together except for inductance $L_2$ in the ferrimagnetic body around which center conductors are wound. Also in the concentrated-constant isolator shown in FIG. 9, a dummy resistance $R_0$ equal to the external impedance $Z_0$ is connected to the second output terminal ③b, and the dummy resistance $R_0$ may be integrated with the above portions A and B as part of the portion C'.

Figure 9:
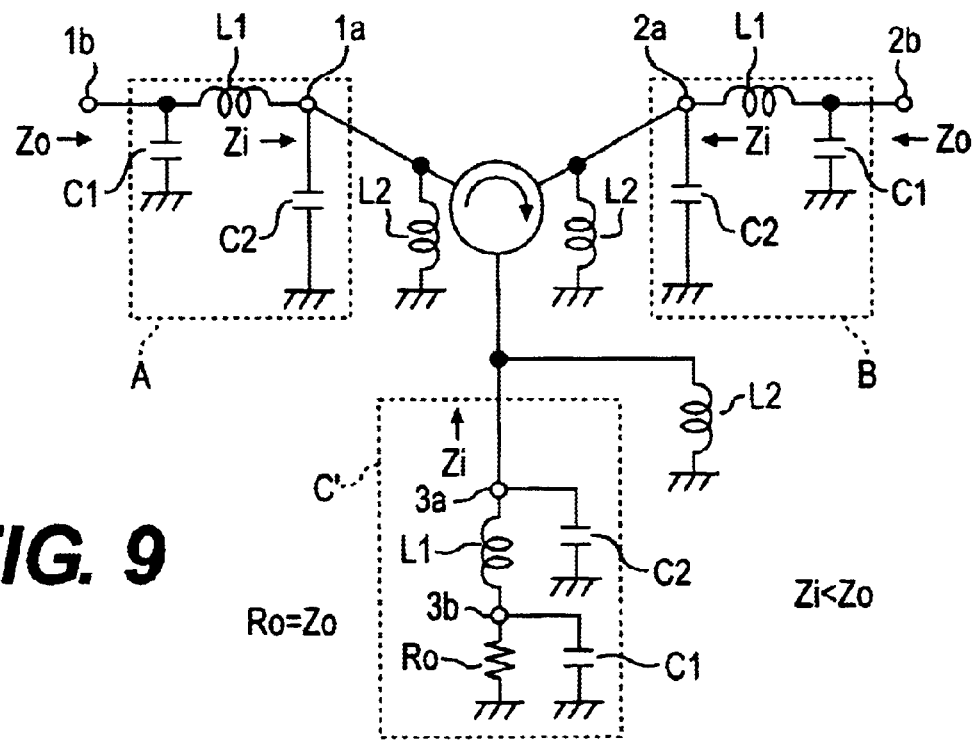
FIG. 9 is a schematic view showing the equivalent circuit of the concentrated-constant isolator according to a still further embodiment of the present invention.
Figure 11:
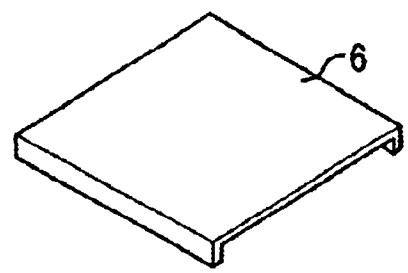
FIG. 11 is an exploded perspective view showing the structure of the concentrated-constant isolator of FIG. 9.
Figure 11:
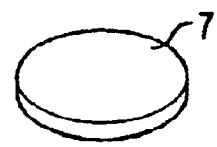
Figure 11:
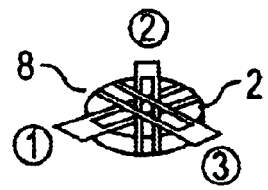
Figure 11:
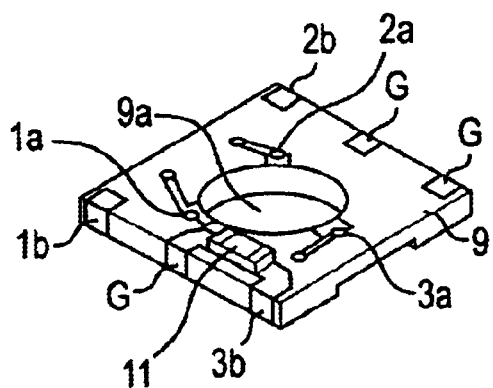
Figure 11:
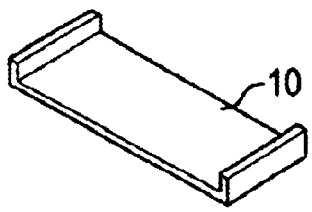

FIG. 11 is an exploded perspective view showing the structure of the concentrated-constant isolator of FIG. 9. This concentrated-constant isolator comprises a laminate (integral structure) 9 made of a dielectric material, which comprises an impedance-converting circuit having inductance $L_1$ and electrostatic capacitance $C_1$, and a load capacitance $C_2$. An assembly 8 constituted by a ferrimagnetic body 2, around which center conductors 1a, 1b and 1c are wound, is mounted in a through-hole 9a of the laminate 9. The second input/output terminals ①b, ②b, ③b and three ground terminals G are thick-film-printed on or transferred to side surfaces of the laminate 9. Further, a chip-shaped dummy resistance 11 is disposed on a connection pattern formed on a top surface of the laminate 9, and the terminal ③b is connected to the ground terminal G. Attached to the ferrimagnetic body 2 are a permanent magnet 7 such as a ferrite magnet for applying the external magnetic field 5, and iron yokes 6, 10 constituting a closed magnetic path.

The integral laminate 9 is formed by printing a conductor paste such as Ag, Cu, etc. on green ceramic sheets made of a dielectric material having a dielectric constant of 5–15 to form electrodes, laminating and pressure-bonding them, and then burning the resultant laminate at a temperature of 800–1100° C.

Figure 12:
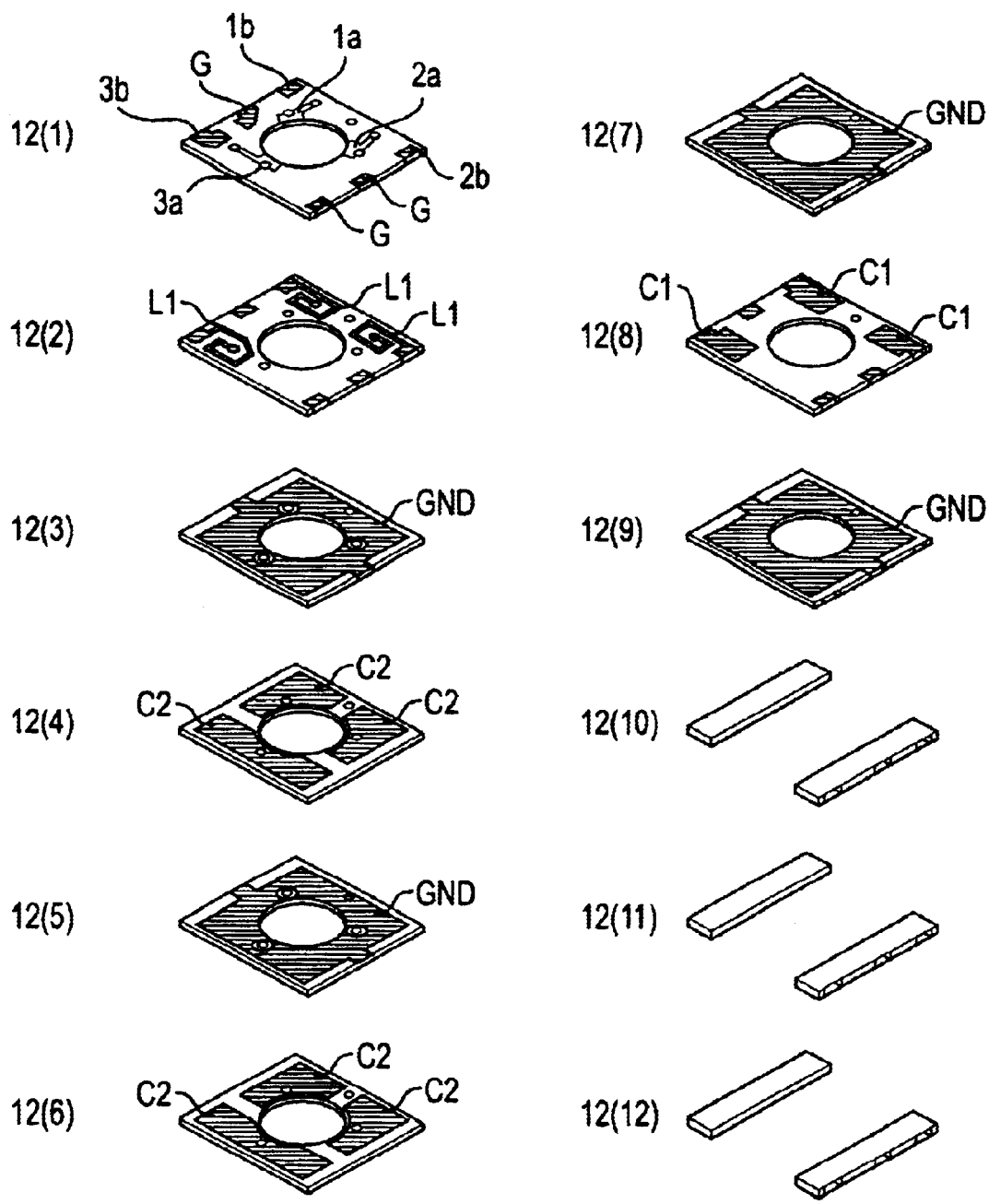
FIG. 12 is an exploded perspective view showing the structure of the integral laminate in the concentrated-constant isolator of FIG. 11.

FIG. 12 is an exploded view showing the integral laminate 9 of FIG. 11. This laminate 9 is formed by lamination of green ceramic sheets 1–12. Formed around a center through-hole 9a of the uppermost sheet 1 are lands (first input/output terminals) ①a, ②a, ③a for connecting the center conductors 1a, 1b and 1c to the load capacitance $C_2$. A sheet 2 below the sheet 1 is provided with spiral line electrodes for constituting inductance $L_1$. Sheets 4, 6 formed with pattern electrodes for constituting load capacitance $C_2$ are alternately laminated with sheets 3, 5 and 7, whose substantially entire surfaces are covered by pattern ground conductors. In this example, the load capacitance $C_2$ is provided by a four-layer laminated capacitor, though the number of lamination may vary depending on the value of a necessary load capacitance $C_2$. The sheet 8 is formed with a pattern electrode constituting electrostatic capacitance $C_1$, and sandwiched by sheets 7, 9, on which pattern ground conductors are formed. Disposed on sheets 10–12 are iron yokes 10 produced by punching, etc.

Figure 13:
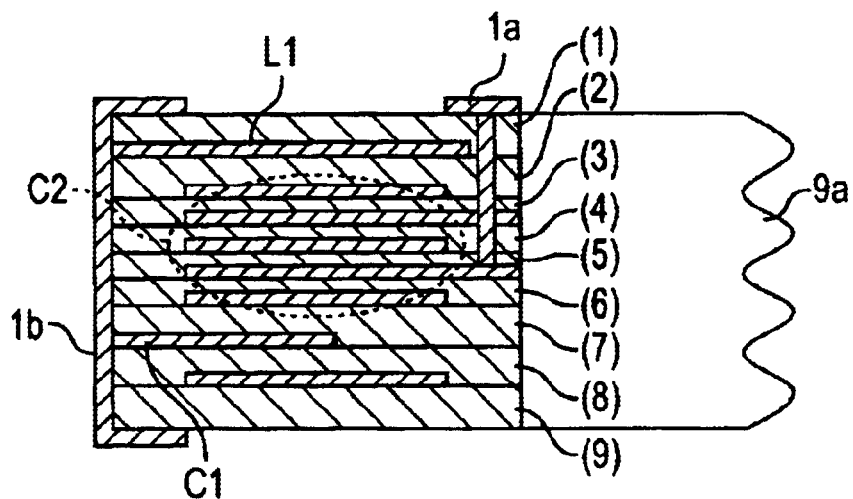
FIG. 13 is a partial cross-sectional view showing the lamination structure of the integral laminate of FIG. 12.

FIG. 13 schematically shows the cross section of the laminate 9 near the second input/output terminal ①b. Inductance $L_1$ and electrostatic capacitance $C_1$ formed in the laminate 9 are connected to each other on a side surface of the laminate 9, and inductance $L_1$ and load capacitance $C_2$ pass through a through-hole electrode to a top surface of the laminate 9, where they form a first input/output terminal ①a connected to center conductors of the assembly 8.

Figure 14:
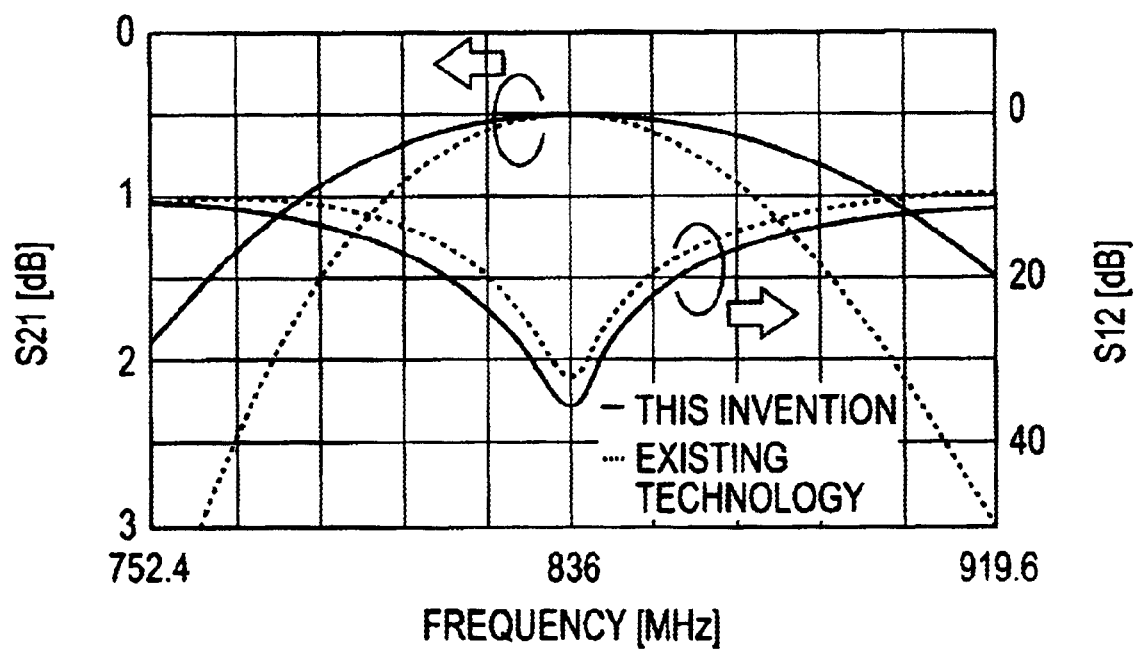
FIG. 14 is a graph showing the relations between an insertion loss S21 and an opposite-direction loss S12 and a frequency in the isolator of the present invention and a conventional isolator.

FIG. 14 shows the electric characteristics of a miniaturized, rectangular-shaped isolator of 5 mm in each side having the structure shown in FIG. 11, together with those of the conventional isolator. This miniaturized isolator had $f_0$=836 MHz, $C_2$=19 pF, $C_1$=2.2 pF, and $L_1$=4.1 nH. With these parameters, the internal input impedance $Z_i$ of the isolator was calculated as 37.4Ω. In FIG. 14, the solid line indicates the electric characteristics of the isolator of the present invention, in which the impedance-converting circuit and the load capacitance $C_2$ are integrated together, and the dotted line indicates the electric characteristics of the conventional isolator matched to an external impedance $Z_0$ without using the impedance-converting circuit. Though both of them have substantially the same insertion loss S21 of about 0.5 dB at a center frequency, the isolator of the present invention is extremely superior to the conventional isolator in that the former has a much wider bandwidth. Also, their comparison in a relative bandwidth at a point where the opposite-direction insertion loss S12 reaches 20 dB or less has revealed that it is 5.8% in the isolator of the present invention, 2% better than 3.8% in the conventional isolator.

Figure 15:
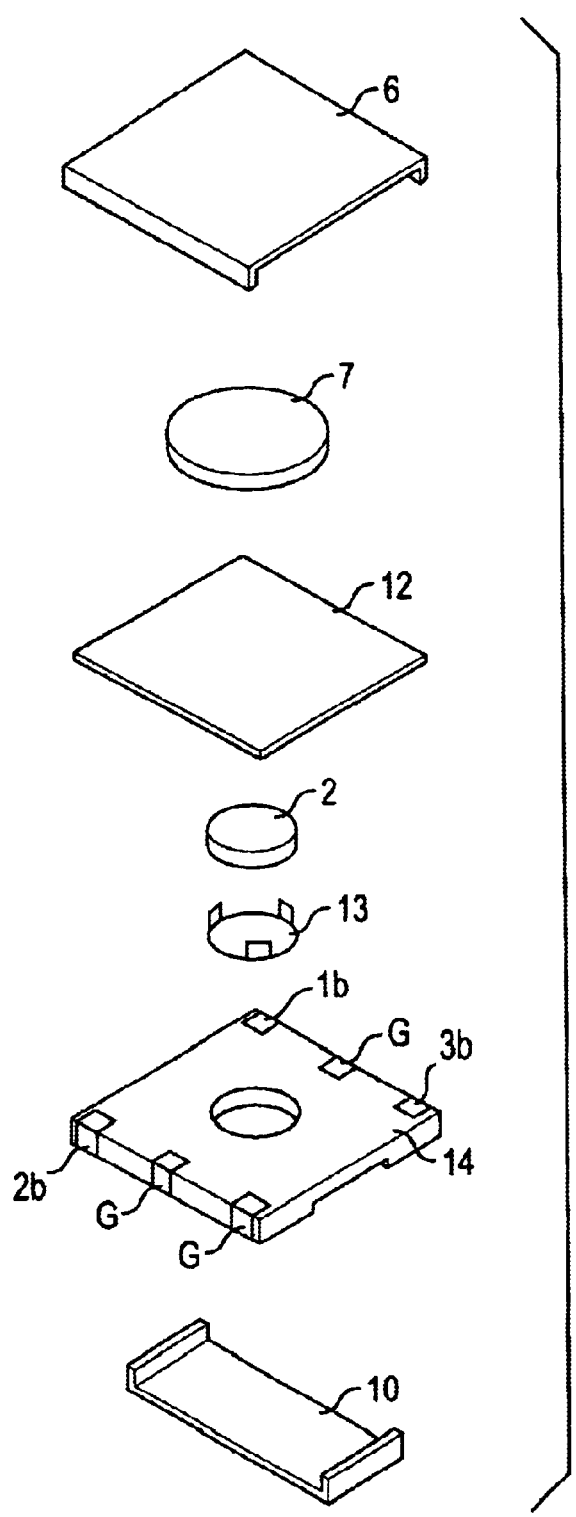
FIG. 15 is a partial cross-sectional view showing the structure of the concentrated-constant isolator according to a still further embodiment of the present invention.

FIG. 15 is an exploded perspective view showing an isolator according to another embodiment of the present invention. Formed by a thin-film-forming method in the integral laminate 12 are an impedance-converting circuits having inductance $L_1$ and electrostatic capacitance $C_1$, and load capacitance $C_2$. Also, a ferrimagnetic body 2 and a ground cap 13 made of a conductor plate are disposed in a center through-hole of the integral laminate from a rear side. The integral laminate 12 is mounted onto a resin structure 14 integrally formed with connection terminals by a ball solder. The resin structure 14 is provided with the second input/output terminals ①b, ②b, the exposed isolation terminal ③b, and three ground terminals G.

Figure 16:
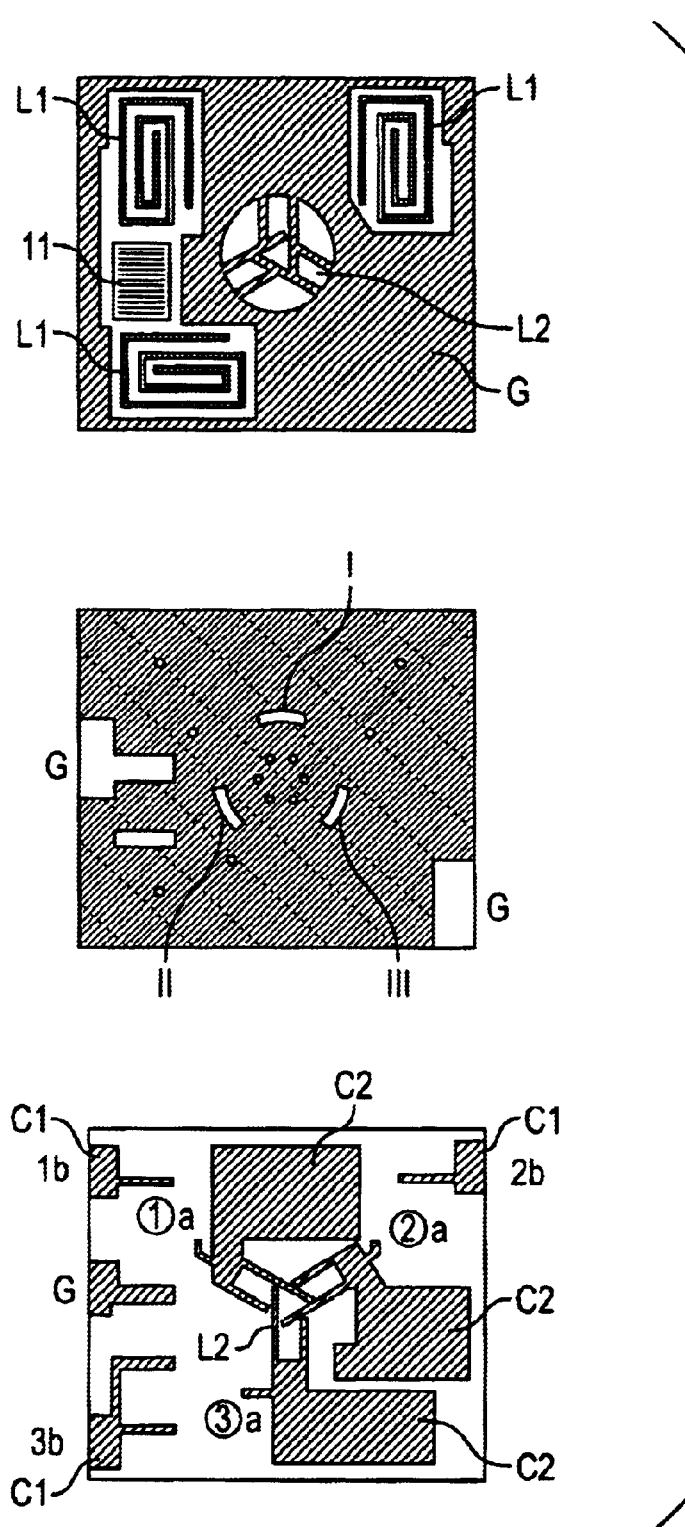
FIG. 16 is an exploded view showing the structure of the integral laminate in the concentrated-constant isolator of FIG. 15.

FIG. 16 is an exploded view of the integral laminate 12 of FIG. 15. Formed at a center of a conductor pattern 1 formed on an insulating substrate are intertwined center conductors. Formed around the center conductors are spiral conductors having inductance $L_1$ and a resister element 11, constituting an impedance-converting circuit. Other hatched portions are ground conductors. An insulating film pattern 2 is formed on the conductor pattern 1. White circle portions are through-holes free from an insulating film, and arcuate portions a, b, c are through-holes for contacting the end projections of the ground cap 13 to the ground conductor of the conductor pattern 1. 3 indicates a conductor pattern formed on the insulating film pattern 2.

A center portion of the conductor pattern 3 passes through a through-hole of the insulating film pattern 2 to have connection to the conductor pattern 1, thereby forming intertwined center conductors. The center conductors constitute inductance $L_2$ in the above equivalent circuit. Load capacitance $C_2$ is formed by three large conductor patterns formed on the other ends of the center conductors and a ground conductor of the conductor pattern 1 via the insulating film pattern 2. Also, electrostatic capacitance $C_1$ of the impedance-converting circuit is formed by small conductor patterns in edge portions and the ground conductor of the conductor pattern 1 via the insulating film pattern 2. The inductance $L_1$ is connected between the first input/output terminals ①a, ②a, ③a and the second input/output terminals ①b, ②b, ③b via through-holes formed in the insulating film pattern 2. Such a structure accelerates further integration, resulting in more miniaturized isolators.

Figure 17:
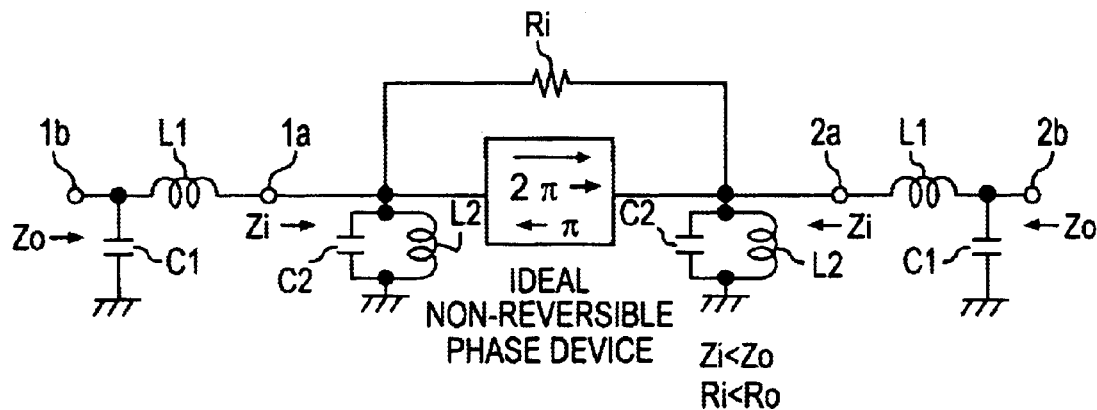
FIG. 17 is a schematic view showing the equivalent circuit of the two-terminal concentrated-constant isolator according to a still further embodiment of the present invention.
Figure 18:
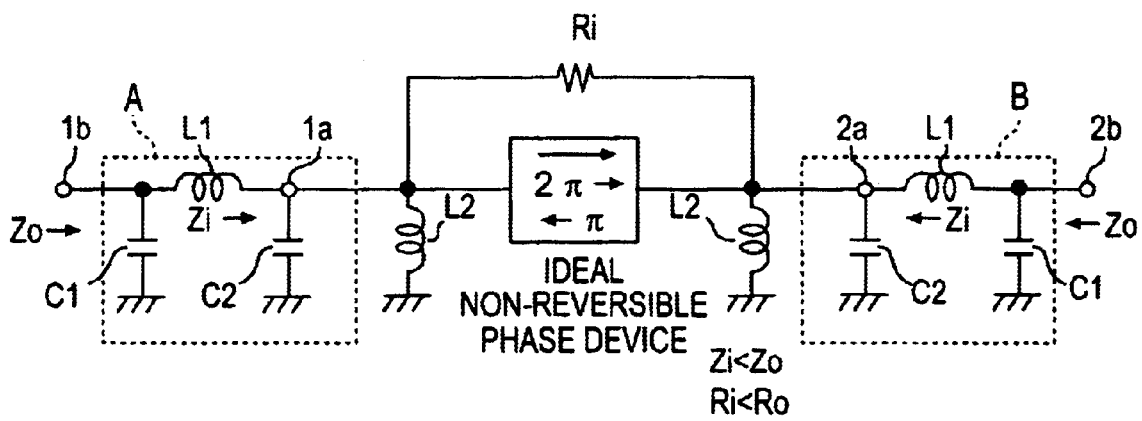
FIG. 18 is a schematic view showing the equivalent circuit of the two-terminal concentrated-constant isolator according to a still further embodiment of the present invention.

FIG. 17 shows the equivalent circuit of the two-terminal concentrated-constant isolator according to one embodiment of the present invention. Like the above isolator, the input impedance $Z_i$ is designed to be smaller than the external impedance $Z_0$, and constituted by inductance $L_1$ and electrostatic capacitance $C_1$ and connected to IMT. As shown in FIG. 18, by integrating portions A and B of each terminal encircled by dotted lines except for center conductor portions $L_2$ of an impedance-converting circuit wound around a ferrimagnetic body, a miniaturized, wide-band, two-terminal, concentrated-constant isolator can be obtained, like the above concentrated-constant isolator.

The present invention will be explained in further detail by the following EXAMPLES without intention of restricting the scope of the present invention thereto.

EXAMPLE 1

Figure 10:
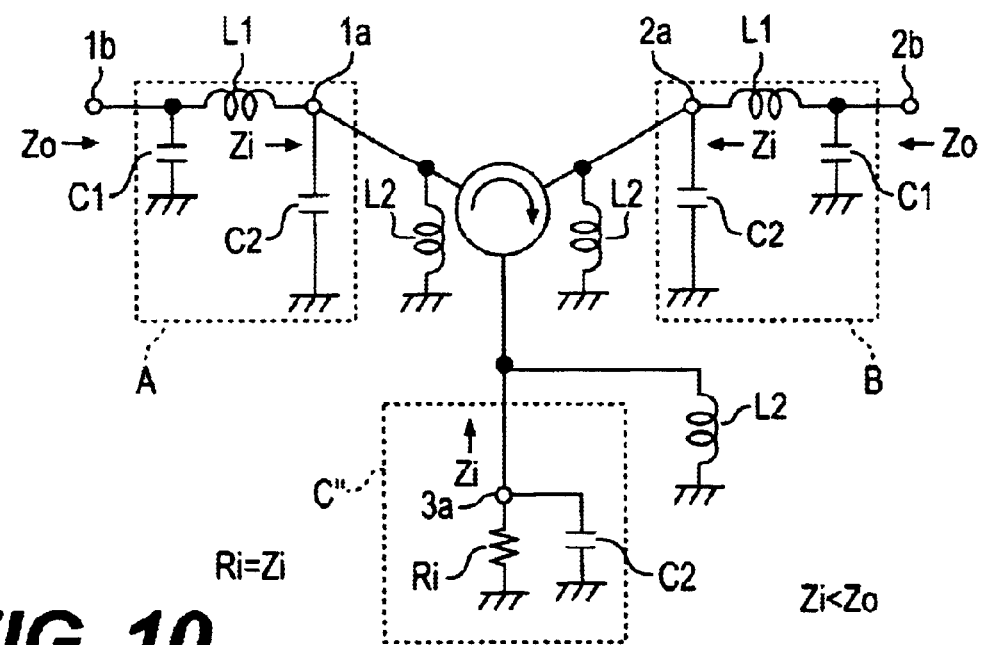
FIG. 10 is a schematic view showing the equivalent circuit of the concentrated-constant isolator according to a still further embodiment of the present invention.
Figure 19:
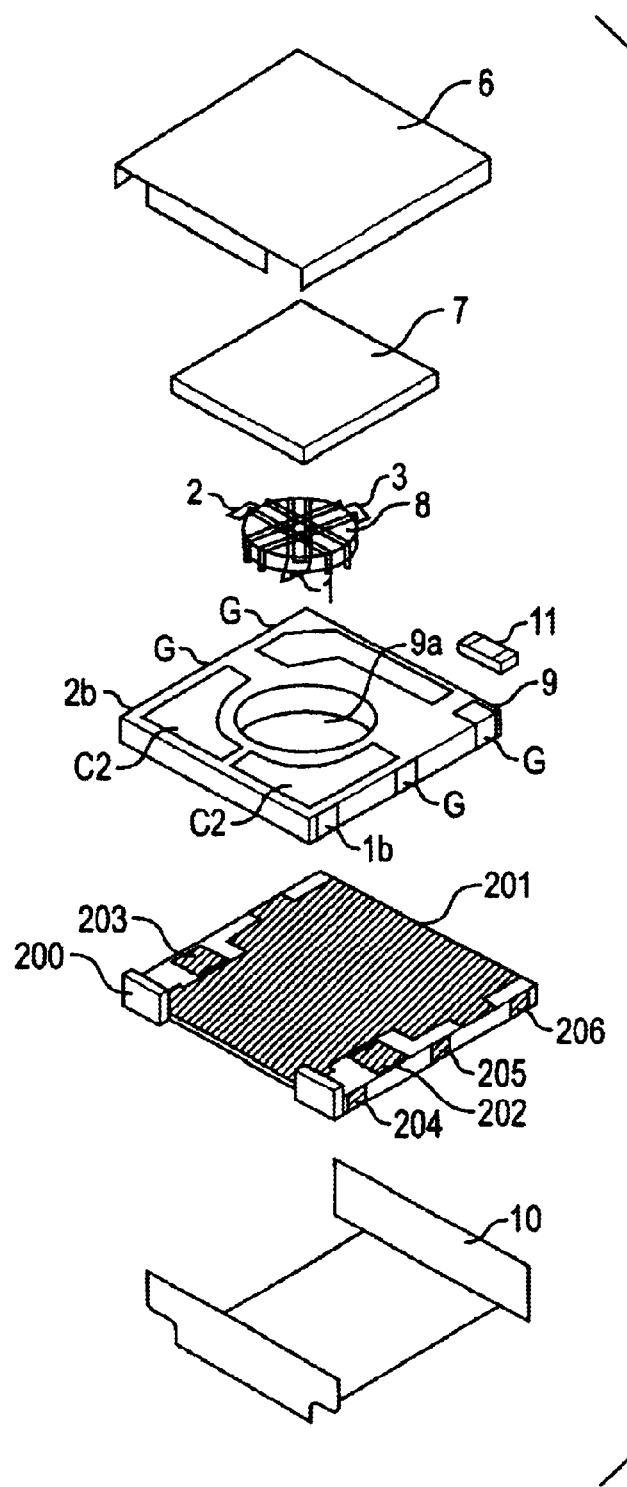
FIG. 19 is an exploded perspective view showing the concentrated-constant isolator in EXAMPLE 1.
Figure 20:
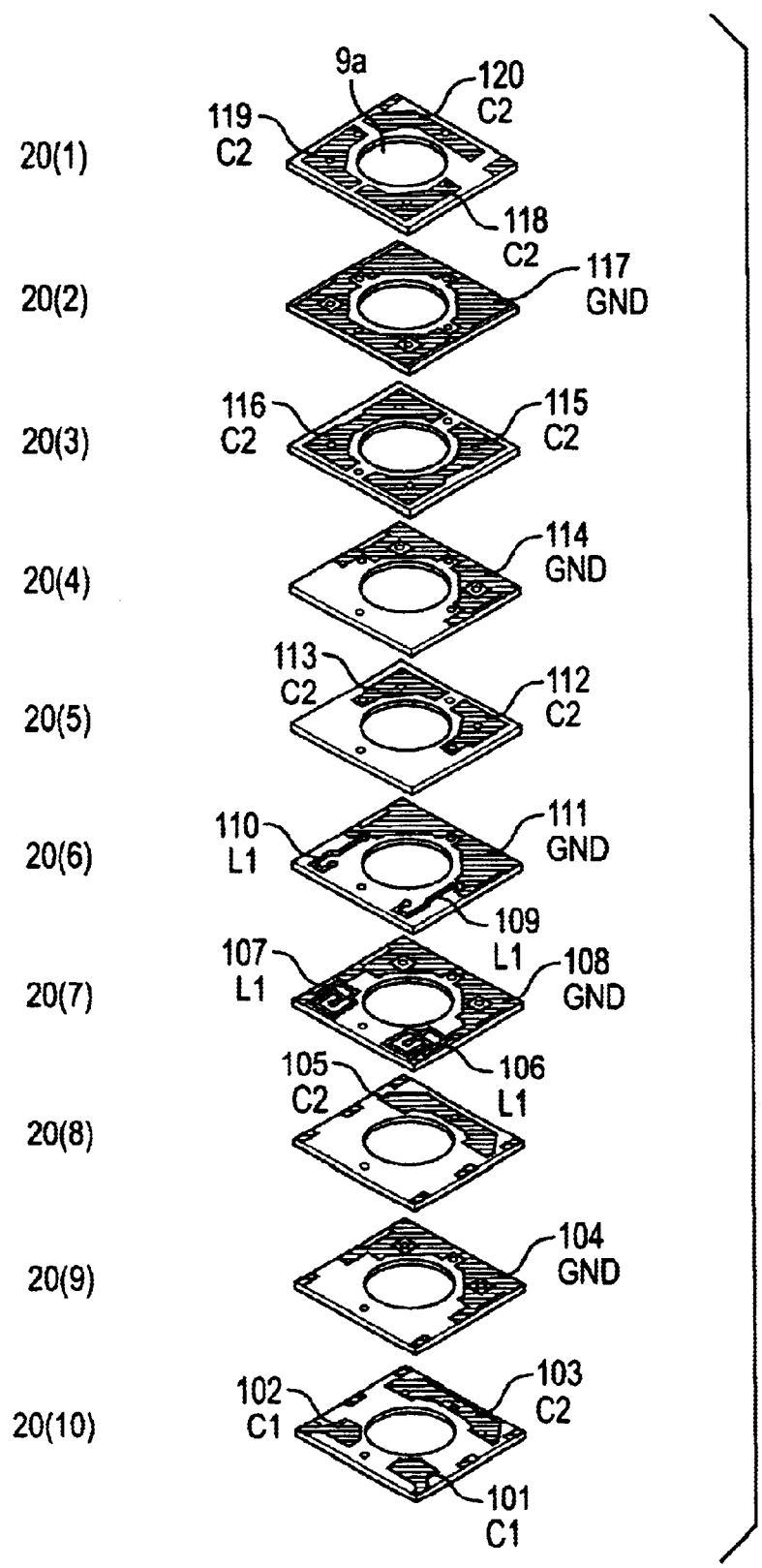
FIG. 20 is an exploded view showing the structure of the integral laminate in the concentrated-constant isolator of FIG. 19.
Figure 21:
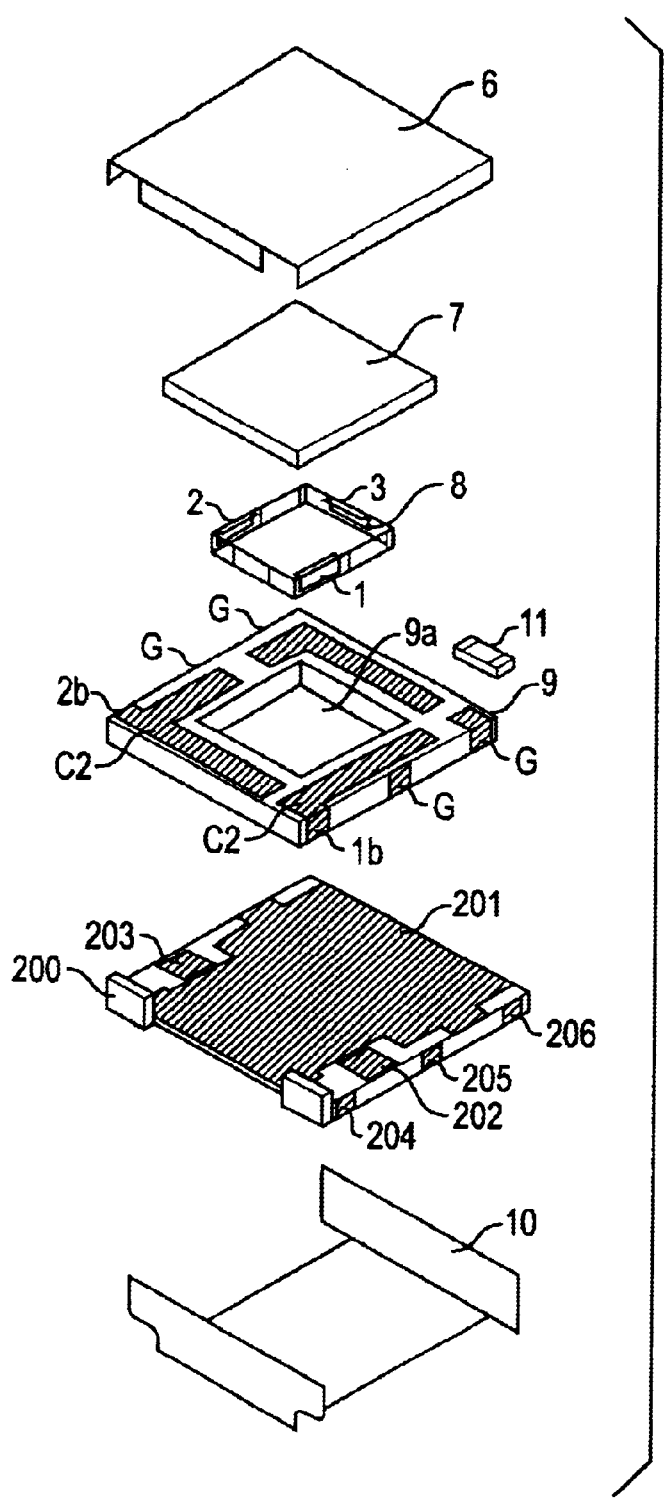
FIG. 21 is an exploded perspective view showing another example of an assembly used in the concentrated-constant, non-reciprocal device of the present invention.

FIG. 19 shows a concentrated-constant isolator in this EXAMPLE, and FIG. 20 shows the internal structure of its integral laminate 9. The integral laminate 9 was produced by forming inductance $L_1$ and electrostatic capacitance $C_1$ of an impedance-converting circuit IMT and load capacitance $C_2$ on sheets made of a dielectric material, and laminating them. The equivalent circuit of this concentrated-constant isolator is the same as shown in FIG. 10. What is different from the concentrated-constant isolator shown in FIG. 9 in terms of an equivalent circuit is that electrostatic capacitance $C_1$ and inductance $L_1$ of an impedance-converting circuit IMT are omitted between the second input/output terminal ③b and the first input/output terminal ③a, and that a dummy resistance $R_i$ equal to $Z_i$ is directly connected to the first input/output terminal ③a. Such a constitution makes the structure of the laminate simple, resulting in further miniaturization of the concentrated-constant isolator.

This laminate 9 was produced by printing a conductor paste based on Ag on green sheets of 50–200 μm in thickness made of low-temperature-sinterable, dielectric ceramic materials to form predetermined electrode patterns, laminating these sheets and burning the resultant laminate for integration. In the concentrated-constant isolator in this EXAMPLE, electrostatic capacitance $C_1$=2.2 pF, load capacitance $C_2$=19 pF, and inductance $L_1$=4.1 nH.

The internal structure of this laminate 9 will be explained in a lamination order referring to FIG. 20. The lowermost green sheet 10 is formed with electrode patterns 101, 102 for capacitors $C_1$ and electrode patterns 103 for capacitors $C_2$ on a top surface, and a ground conductor (not shown) and a pair of terminal electrodes (not shown) on a rear surface. The green sheet 10 and other green sheets are provided with through-hole electrodes (indicated by black circles in the figure) in their edge portions, such that connection is achieved through the through-hole electrodes between the electrode patterns formed in the laminate 9 and the ground conductors and a pair of terminal electrodes.

Laminated on the green sheet 10 is a green sheet 9 formed with a ground conductor 104, and further a green sheet 8 formed with an electrode pattern 105 for capacitor $C_2$. The electrode pattern 105 formed on the green sheet 8 is connected to an electrode pattern 103 formed on a green sheet 10 via through-hole electrodes formed in the green sheet 9. Also, the electrode pattern 105 formed on the green sheet 8 is connected to an electrode pattern 120 for a capacitor $C_2$ formed on a top surface of the green sheet 1 via through-hole electrodes of the green sheets 1–7. Thus, the capacitor $C_2$ inside the dotted line C" shown in FIG. 10 is formed between the ground conductor on a rear surface and the ground conductors 104, 108 and 117.

Laminated then is a green sheet 7 formed with line electrodes 106, 107 for inductance $L_1$ and a ground conductor 108. Laminated thereon is a green sheet 6 formed with line electrodes 109, 110 for inductance $L_1$ and a ground conductor 111. Inductance $L_1$ inside the dotted line A shown in FIG. 10 is formed by connecting the line electrodes 106 and 109 via a through-hole electrode, and inductance $L_1$ inside the dotted line B shown in FIG. 10 is formed by connecting the line electrodes 107 and 110 via a through-hole electrode.

Next, a green sheet 5 formed with electrode patterns 112, 113 for capacitor $C_2$ is laminated. These electrode patterns 112, 113 are connected to ends of line electrodes 109,110 via through-hole electrodes. Further, via through-hole electrodes formed in the green sheets 1–4 electrode patterns 115, 116 for capacitor $C_2$ formed on a green sheet 3 are connected to electrode patterns 118, 119 for capacitor $C_2$ formed on a top surface of a green sheet 1. As a result, capacitor $C_2$ inside the dotted line A in FIG. 10 is formed by the electrode patterns 112, 115, 118, and capacitor $C_2$ inside the dotted line B in FIG. 10 is formed by the electrode patterns 113, 116, 119.

After laminating the green sheet 4 formed with a ground conductor 114, the green sheet 3, the green sheet 2 formed with a ground conductor 117 and the green sheet 1 in this order and pressure-bonding them, a through-hole 9a is formed in a center portion of the laminate by punching by a die. The resultant green sheet laminate is burned for integration to obtain an integral laminate 9 of 5.0 mm×4.5 mm×0.5 mm in outer size. Mounted onto this laminate 9 is a chip resister 11. As an alternative method for forming a through-hole 9a, green sheets partly punched in advance may be laminated.

This laminate 9 is mounted in a resin casing 200 equipped with conductor plates for connecting a rear ground conductor to terminal electrodes, and external terminals 202, 204, 205, 206. Disposed in the through-hole 9a of the laminate 9 is an assembly 8 comprising a disc-shaped ferrimagnetic body 2 of 2.2 mm in diameter and 0.5 mm in thickness, and three center conductors 1a, 1b, 1c overlapping on the ferrimagnetic body 2 in an insulated manner. The center conductors are soldered to the conductor patterns 118, 119, 120 of the laminate 9.

Mounted onto a lower yoke 10 is the resin casing 200 having a bottom shape adapted to the lower yoke 10, and the lower yoke 10 is soldered to the bottom surface of the resin casing 200. Next, the laminate 9 comprising the assembly 8 is soldered to a top surface of the resin casing 200. After a ferrite magnet 7 for applying a DC magnetic field to the ferrimagnetic body 2 in the assembly 8 is fixed to an upper yoke 6, the upper yoke 6 is combined with the lower yoke 10 to complete an isolator.

In this EXAMPLE, part of the electrode pattern constituting the capacitor $C_2$ is formed on an outer surface of the laminate 9. With such a structure, even when the center frequency $f_0$ deviates from the desired frequency, the electrode patterns can be trimmed to adjust the capacitance of the capacitor $C_2$, thereby easily adjusting the center frequency $f_0$.

When a gap is narrowed between the line electrode constituting inductance $L_1$ and the ground conductor, parasitic capacitance increases due to difference in potential between the line electrode and the ground conductor. Thus, the loss of the impedance-converting circuit IMT increases, which may result in mismatching in impedance with the lines for connecting the concentrated-constant non-reciprocal circuit, and deterioration in electric characteristics. Accordingly, a concentrated-constant isolator comprising a laminate 9 having a ground conductor on a green sheet 4 or a green sheet 5 was produced to evaluate insertion loss characteristics. The results are shown in Table 1.

TABLE 1

| | Distance Between Line Electrode and Ground Electrode (mm) | | |
|---|---|---|---|
| | 0.05 | 0.10 | 0.20 |
| Insertion Loss (dB) | 1.25 | 0.65 | 0.45 |

As shown in Table 1, the wider the distance in a lamination direction between the electrode and the ground conductor, the smaller the insertion loss. When the distance is 100 $\mu$m or more, a desired level of insertion loss can be achieved for practical purposes.

Though the concentrated-constant isolator in this EXAMPLE comprises one ferrimagnetic body, the same effects can be obtained by sandwiching a plurality of center conductors by two or more ferrimagnetic bodies. The curve B in FIG. 6 shows a case where two ferrimagnetic bodies are used, verifying that further improved effects are obtained by using two ferrimagnetic bodies. The effects of the present invention can also be obtained by using, as a structure in which center conductors are wound around the ferrimagnetic body, a ferrimagnetic body laminate produced by printing metal electrodes for center conductors on thin green sheets made of ferrimagnetic powder, laminating a plurality of printed green sheets, and sintering the resultant laminate at a high temperature of 800° C or higher.

Applicability in Industry

As described above in detail, in the concentrated-constant, non-reciprocal device of the present invention, the miniaturization of a ferrimagnetic body does not result in deterioration in electric characteristics. Therefore, a miniaturized, wide-band, concentrated-constant circulator/isolator can be provided while maintaining excellent electric characteristics.

What is claimed is:

1. A concentrated-constant, non-reciprocal device comprising:

a permanent magnet for applying a DC magnetic field to a ferrimagnetic body;

an assembly comprising a plurality of center conductors wound around or at least partly embedded in said ferrimagnetic body, each center conductor having one end as a common terminal and the other end as a first input/output terminal;

a plurality of second input/output terminals;

a plurality of respective impedance-converting circuits connected to said second input/output terminals and said first input/output terminals; and a plurality of respective load capacitors having a load capacitance connected to said first input/output terminals and a ground conductor, wherein said concentrated-constant, non-reciprocal device is operated at an internal impedance of $Z_i$, wherein said internal impedance $Z_i$ is smaller than an external impedance $Z_0$ connected to said second input/output terminals, and wherein a conversion ratio $Z_i/Z_0$ in said impedance-converting circuit meets the relation of $0.05 \leq Z_i/Z_0 \leq 0.9$ at a center frequency $f_0$ at which said concentrated-constant, non-reciprocal device is operated, wherein each impedance-converting circuit includes an inductance between said first input/output terminals and said second input/output terminals, and an electrostatic capacitance between said second input/output terminals and said ground conductor, said electrostatic capacitance being smaller than said load capacitance, and said inductance being less than an inductance value L1 obtained by the following equation:

$$L1 = 3979/f_0,$$

wherein $f_0$ represents the center frequency in megahertz and L1 represents the inductance value in nanohenry.

2. The concentrated-constant, non-reciprocal device according to claim 1, wherein said inductance and said electrostatic capacitance of said impedance-converting circuits and said load capacitance are formed in an integral structure.

3. The concentrated-constant, non-reciprocal device according to claim 4, wherein the number of said center conductors is three, and a resistor is connected between said first input/output terminal of one of said center conductors and said ground conductor or said common terminal, said resistor being mounted as a chip resistor on a laminate of a dielectric material, whereby said concentrated-constant, non-reciprocal device is operated as an isolator.

4. The concentrated-constant, non-reciprocal device according to claim 2, wherein said inductance of said impedance-converting circuit is formed by at least one line electrode, and said electrostatic capacitance and said load capacitance of said impedance-converting circuit are formed by a plurality of pattern electrodes, said at least one line electrode comprising a first line electrode, said pattern electrodes comprising a first pattern electrode for forming said electrostatic capacitance and a second pattern electrode and a third pattern electrode for forming said load capacitance, said first pattern electrode being formed on a different layer of said integral structure from said second pattern electrode and said third pattern electrode, said first line electrode having a first end connected via a first through-hole electrode to one of said second pattern electrode and said third pattern electrode, and said first line electrode having a second end connected to said first pattern electrode placed under said first line electrode via at least one of a second through-hole electrode and an input/output terminal formed on the side surface of said integral structure.

5. The concentrated-constant, non-reciprocal device according to claim 4, wherein said electrode patterns forming said load capacitance is formed partly on the outer surface of said integral structure at a position opposite to said permanent magnet, thereby making it possible to trim said electrode patterns to adjust the capacitance of said load capacitor.

6. The concentrated-constant, non-reciprocal device according to claim 4, wherein said integral structure has a ground electrode, and the distance in a lamination direction between said line electrode forming said inductance of said impedance-converting circuit and the ground conductor is 100 μm or more.

7. The concentrated-constant, non-reciprocal device according to claim 1, wherein the number of said center conductors is three, and one of said impedance-converting circuits being connected to each of said first input/output terminals of two of said center conductors and a resistor corresponding to an internal impedance $Z_i$ being connected between said first input/output terminal of the remaining one of center conductors and said ground conductor or said common terminal, whereby said concentrated-constant, non-reciprocal device is operated as an isolator.

* * * * *

UNITED STATES PATENT AND TRADEMARK OFFICE
CERTIFICATE OF CORRECTION

PATENT NO.    : 6,696,901 B1
DATED         : February 24, 2004
INVENTOR(S)   : Shigeru Takeda et al.

It is certified that error appears in the above-identified patent and that said Letters Patent is hereby corrected as shown below:

<u>Title page,</u>
Item [54], title, "CONCENTRATED CONSTANT IRRECIPROCAL DEVICE"
should read -- CONCENTRATED-CONSTANT, NON-RECIPROCAL DEVICE --.

<u>Column 12,</u>
Line 61, "claim 4," should read -- claim 2, --.

Signed and Sealed this

Twenty-seventh Day of April, 2004

JON W. DUDAS
*Acting Director of the United States Patent and Trademark Office*